(12) United States Patent  
Mauder et al.

(10) Patent No.: US 9,318,483 B2  
(45) Date of Patent: Apr. 19, 2016

(54) REVERSE BLOCKING TRANSISTOR DEVICE

(71) Applicant: Infineon Technologies Austria AG, Villach (AT)

(72) Inventors: Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 140 days.

(21) Appl. No.: 14/138,244

(22) Filed: Dec. 23, 2013

(65) Prior Publication Data

US 2015/0179633 A1 Jun. 25, 2015

(51) Int. Cl.
| | |
|---|---|
| *H01L 27/06* | (2006.01) |
| *H03K 17/687* | (2006.01) |
| *H01L 29/78* | (2006.01) |
| *H01L 29/10* | (2006.01) |

(52) U.S. Cl.
CPC ........ *H01L 27/0629* (2013.01); *H01L 29/1095* (2013.01); *H01L 29/7803* (2013.01); *H03K 17/687* (2013.01)

(58) Field of Classification Search
USPC .......... 327/108–109, 427, 434; 257/341, 342, 257/E29.148, E29.012, E29.256, E29.271, 257/E29.311

See application file for complete search history.

(56) References Cited

U.S. PATENT DOCUMENTS

| | | | |
|---|---|---|---|
| 8,110,868 B2 | 2/2012 | Pfirsch et al. | |
| 8,247,874 B2 | 8/2012 | Hirler et al. | |
| 8,461,648 B2 | 6/2013 | Pfirsch et al. | |
| 8,643,086 B2 | 2/2014 | Pfirsch et al. | |
| 9,064,953 B2 * | 6/2015 | Mauder et al. | |
| 2004/0043565 A1 | 3/2004 | Yamaguchi et al. | |
| 2004/0218621 A1 | 11/2004 | Dove | |
| 2007/0023830 A1 | 2/2007 | Pfirsch et al. | |
| 2007/0108513 A1 | 5/2007 | Rub et al. | |
| 2009/0218621 A1 | 9/2009 | Pfirsch et al. | |
| 2013/0249602 A1 | 9/2013 | Mauder et al. | |
| 2014/0001528 A1 | 1/2014 | Pfirsch et al. | |
| 2014/0063882 A1 * | 3/2014 | Hirler et al. | .................. 363/127 |

FOREIGN PATENT DOCUMENTS

EP 2261992 A2 12/2010

OTHER PUBLICATIONS

Mauder, Anton et al., "Semiconductor Device Including a Drift Zone and a Drift Control Zone", U.S. Appl. No. 13/915,934 filed Jun. 12, 2013.

* cited by examiner

*Primary Examiner* — An Luu  
(74) *Attorney, Agent, or Firm* — Murphy, Bilak & Homiller, PLLC

(57) ABSTRACT

A transistor device includes at least one transistor cell. The cell includes a drift region, a source region, a body region arranged between the source region and the drift region, and a drain region. The drift region is arranged between the body region and the drain region. A gate electrode is adjacent the body region and dielectrically insulated from the body region by a gate dielectric. A channel region of a doping type complementary to a doping type of the drain region is arranged between the drift region and the drain region. A drift control region is adjacent the drift region and dielectrically insulated from the drift region and the channel region by a drift control region dielectric. A first switch is coupled between the drift control region and the drain region.

25 Claims, 6 Drawing Sheets

REVERSE BLOCKING TRANSISTOR DEVICE

TECHNICAL FIELD

Embodiments of the present invention relate to a transistor device, in particular a reverse blocking transistor device, such as a reverse blocking MOSFET.

BACKGROUND

Transistor devices, such as MOSFETs, are widely used as electronic switches in various types of electrical applications, such as drive applications, power conversion applications, household applications, or consumer electronic applications. A MOSFET is a voltage controlled device that switches on and off dependent on a drive voltage applied to a gate terminal. However, a conventional power MOSFET, that is a MOSFET that is suitable for switching electrical loads, includes an internal diode (usually referred to as body diode) that can be forward biased independent of the drive voltage. For example, in an n-type MOSFET, the body diode conducts independent of the drive voltage whenever a positive voltage is applied between a source terminal and a drain terminal of the MOSFET. When the body voltage is reverse biased, the MOSFET switches on and off dependent on the drive voltage. Thus, a conventional MOSFET is only capable to switch on and off when a voltage with a first polarity is applied between the drain and source terminals, while it always conducts when a voltage with a second polarity opposite the first polarity is applied between the drain and source terminals.

However, there is a need to provide a transistor device, in particular a MOSFET that is capable of switching on and off independent of a polarity of a voltage between the load terminals.

SUMMARY

One embodiment relates to a transistor device including at least one transistor cell. The at least one transistor cell includes a drift region, a source region, a body region arranged between the source region and the drift region, and a drain region, wherein the drift region is arranged between the body region and the drain region. A gate electrode is adjacent the body region, and is dielectrically insulated from the body region by a gate dielectric. A channel region of a doping type complementary to a doping type of the drain region is arranged between the drift region and the drain region. A drift control region is adjacent the drift region, and the channel region and is dielectrically insulated from the drift region by a drift control region dielectric. Further, a first switching element is coupled between the drift control region and the drain region.

Another embodiment relates to a method for operating a transistor device. The transistor device includes a drift region, a source region, a body region arranged between the source region and the drift region, and a drain region. The drift region is arranged between the body region and the drain region. A gate electrode is adjacent the body region and dielectrically insulated from the body region by a gate dielectric. A channel region of a doping type complementary to a doping type of the drain region is arranged between the drift region and the drain region. A drift control region id adjacent the drift region and dielectrically insulated from the drift region and the channel region by a drift control region dielectric. A first switch is coupled between the drift control region and the drain region. The method includes switching on the first switch when the transistor device is in an on-state and switching off the first switch when the transistor device is in an off-state.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
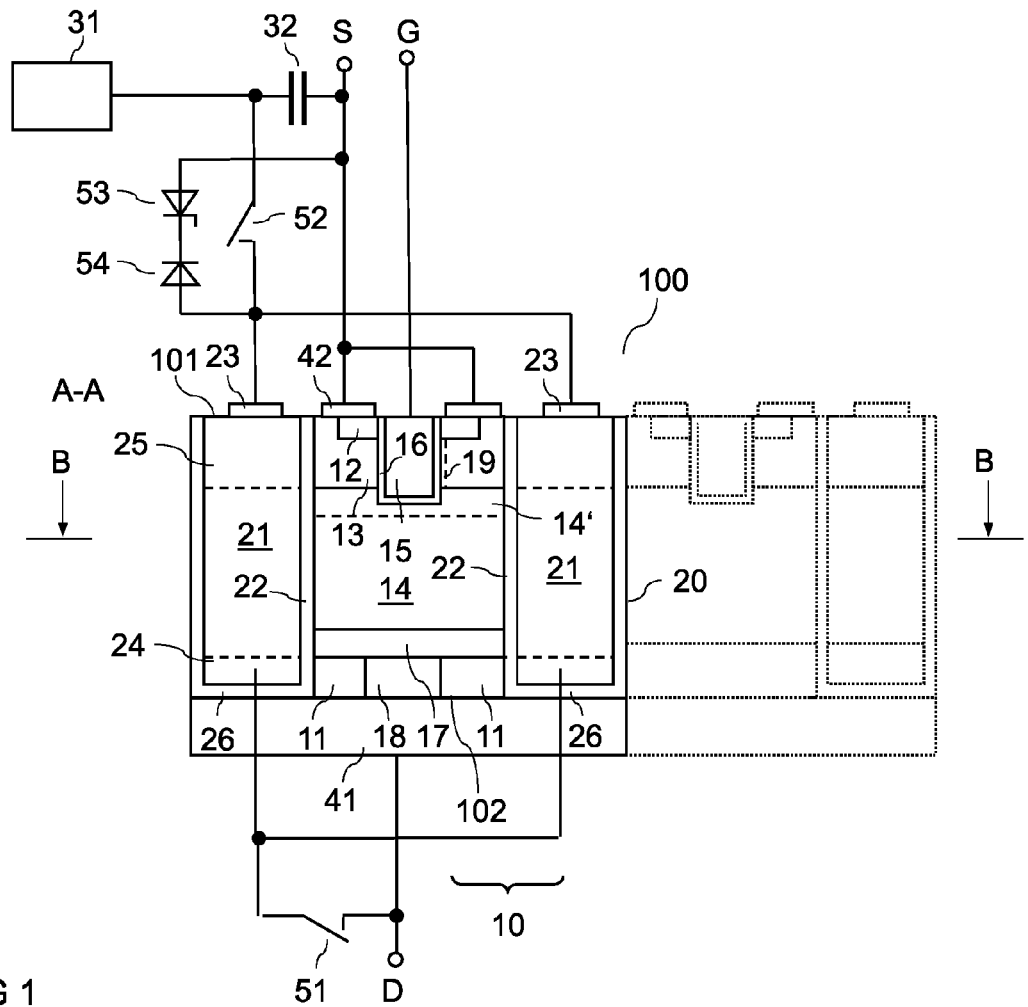
FIG. 1 shows a vertical cross sectional view of a reverse blocking transistor device according to one embodiment.

FIG. 1 illustrates a vertical cross sectional view of a reverse blocking transistor device, in particular a reverse blocking MOSFET, according to one embodiment. The transistor device includes doped device regions that are integrated in a semiconductor body 100. FIG. 1 shows a vertical cross sectional view of the semiconductor body 100, which is a cross sectional view in a vertical section plane that extends perpendicular to a first surface 101 and a second surface 102 of the semiconductor body 100.

The transistor device includes at least one transistor cell 10, but may include a plurality of transistor cells (as illustrated in dotted lines in FIG. 1). These transistor cells are connected in parallel in a way explained in further detail herein below.

Referring to FIG. 1, each transistor cell 10 includes a drain region 11, a source region 12, a body region 13 and a drift region 14. The drain and source regions 11, 12 are spaced apart in a current flow direction of the transistor device. In the present embodiment, the current flow direction is the vertical direction of the semiconductor body 100. The body region 13 is arranged between the source region 12 and the drift region 14, and the drift 14 region is arranged between the body region 13 and the drain region. The drain region 11 is electrically connected to a drain electrode 41. The drain electrode 41 forms a drain terminal D or is electrically coupled to a drain terminal D. The source region 12 and the body region 13 are electrically connected to a source electrode 42 which forms a source terminal S, or which is electrically coupled to a source terminal S.

Each transistor cell 10 further includes a gate electrode 15, and a gate dielectric 16. The gate electrode 15 is adjacent the body region 13 and is dielectrically insulated from the body region 13 by the gate dielectric. The gate electrode 15 is electrically coupled to a gate terminal G.

The gate dielectric 16 can be a conventional gate dielectric and includes, for example, an oxide or a nitride. In the example illustrated in FIG. 1, the gate electrode 15 is a trench electrode, which is an electrode arranged in a trench of the semiconductor body 100. However, this is only an example. The gate electrode 15 could also be implemented as a planar electrode (not shown) above the first surface 101 of the semiconductor body.

Each transistor cell further includes a channel region 17 that has a doping type complementary to a doping type of the source region 12, and is arranged between the drift region 14 and the drain region 11. This channel region is electrically coupled to the drain electrode 41 through a coupling region 18. This coupling region may have the same doping type as the channel region 17, and a higher doping concentration than the channel region 17.

Referring to FIG. 1, each transistor cell further includes a drift control region 21 that is dielectrically insulated from the drift region 14 and the channel region 17 by a drift control region dielectric 22. The drift control region 21 is configured to generate a conducting channel in the drift region 14, and the channel region 17 along the drift control region dielectric 22 when the transistor device is in an on-state. The transistor device is in the on-state when an electrical potential is applied to the gate terminal G that generates a conducting channel in the body region 13 between the source region 12 and the drift region 14 along the gate dielectric 16, and when an electrical voltage is applied between the drain and the source terminals D, S.

In the on-state of the transistor device, the conducting channel in the drift region 14 along the drift control region dielectric 22 reduces the electrical resistance of the drift region 14 and, therefore, reduces the on-resistance of the transistor device. The generation of this conducting channel in the drift region 14 by the drift control region 21 is explained in further detail herein below. The conducting channel along the gate control region dielectric 22 in the drift region 14 is an accumulation channel when the drift region 14 has the same doping type as the source and drain regions 12, 11, and is an inversion channel, when the drift region 14 is doped complementarily to these source and drain regions 12, 11. The doping type of the drift control region 21 can correspond to the doping type of the drift region 14, or can be complementary.

In the on-state, the drift control region 21 not only generates a conducting channel in the drift region 14 along the drift control region dielectric 22, but also in the channel region 17, so that there is an electrically conducting path from the drain region 11 to the source region 12 via the channel region 17, the drift region 14, and the body region 13. This is also explained in further detail herein below.

In case the transistor device includes a plurality of transistor cells 10, these transistor cells are connected in parallel by having the drain regions 11 coupled to the (common) drain terminal D, by having the source regions 12 coupled to the (common) source terminal S, and by having the gate electrodes 15 coupled to the common gate terminal G. Referring to FIG. 1, two neighboring transistor cells 10 may share a drift region, and two (other) neighboring transistor cells may share one drift control region 21.

The transistor device can be implemented as an n-type MOSFET or as a p-type MOSFET. In an n-type MOSFET, the source region 12 and the drain region are n-doped while the body region 13 is p-doped. In a p-type MOSFET, the source region and the drain region are p-doped while the body region 13 is n-doped. The doping concentration of the drain region and the source region 11, 12 is, for example in the range of between $5E17$ cm$^{-3}$ and $1E21$ cm$^{-3}$. The doping concentration of the body region 13 is, for example, in the range of between $1E16$ cm$^{-3}$ and $1E19$ cm$^{-3}$. The doping concentration of the drift region 14 is, for example, in the range of between $1E12$ cm$^{-3}$ and $5E15$ cm$^{-3}$. The doping concentration of the channel region 17 is, for example, in the range of between $1E16$ cm$^{-3}$ and $1E19$ cm$^{-3}$.

The MOSFET can be implemented as an enhancement (normally-off) MOSFET or as a depletion (normally-on) MOSFET. In an enhancement MOSFET, the body region 13 extends to the gate dielectric 16, so that in the on-state the gate electrode generates an inversion channel in the body region 13 along the gate dielectric 16. In a depletion MOSFET, either the body region 13 includes at least along the gate dielectric 16 channel region 19 (illustrated in dashed lines) of the same conductivity type as the source region 12 and extending along the gate dielectric between the source region 12 and the drift region 14, or the gate dielectric 16 includes fixed charges (positive charges in an n-type MOSFET) that cause a conducting channel in the body region 13 when a drive voltage (gate-source voltage) applied to the gate electrode 15 is zero.

In the transistor device illustrated in FIG. 1, the drift region 14 may have the same doping type (conductivity type) as the source region 12 and the drain region 11. However, it is also possible for the drift region 14 to have a doping type that is complementary to a doping type of the source and drain regions 12, 11. In the latter case, there may be a section 14' (illustrated in dashed lines in FIG. 1) of the drift region 14 between the drift control region dielectric 22 and the channel region 19 in the body region 13 of the transistor that has the same doping type as the source region 12.

In an embodiment (not shown) in which the drift control region dielectric 22 adjoins the gate dielectric 16, so that the channel along the drift control region dielectric 22 adjoins the channel region 19 in the body region 13, this section 14' can be omitted when. The "channel region" in the body region 13 is a region of the body region 13 along the gate dielectric 16 where the gate electrode 15 controls a conducting channel.

Referring to FIG. 1, the transistor device further includes a biasing source 31 coupled to the drift control region 21 via a contact electrode 23. According to one embodiment (not illustrated) the biasing source 31 includes a rectifier element, such as a diode, connected between the gate terminal G and the drift control region 21. A capacitive element 32, such as a capacitor, may be coupled between the drift control region 21 and a terminal for a reference potential. This terminal for the reference potential may be the source terminal S (as illustrated).

A doping type of the drift control region 21 may correspond to a doping type of the drift region 14, or may be complementary to a doping type of the drift region 14. When the drift control region 21 has the same doping type as the source region 12 there is an optional region 25 of a doping type complementary to a doping type of the source region 12 arranged between the drift control region 21 and the biasing source 31. This connection region 25 may act as a source for charge carriers that are required in the drift control region 21 when the transistor device is in an on-state. Thus, this semiconductor region 25 can also be referred to as charge carrier source region. According to one embodiment, the contact electrode 23 does not extend along the complete length and/or the complete width of the drift control region 21 on the first surface 101. The "length of the drift control region 21" is the dimension in a direction perpendicular to the section plane shown in FIG. 1, and the "width" is the dimension in the lateral direction shown in FIG. 1 of the semiconductor body 100. In this embodiment, the optional semiconductor region 25 may be omitted in those regions where the contact electrode 23 does not contact the first surface 101. In those regions, the drift control region 21 may extend to the first surface 101.

Referring to FIG. 1, the transistor device further includes a first switch 51 coupled between the drift control region 21 and the drain terminal D, and a second switch 52 coupled in series with the capacitive element 32 and coupled between the drift control region 21 and the terminal for the reference potential (source terminal S). In the embodiment shown in FIG. 1, the second switch 52 is coupled between the drift control region 21 and the capacitive element 32. However, this is only an example. It is also possible to couple the second switch 52 between the capacitive element 32 and the reference potential terminal. In this case, a further switch or a rectifier element, such as a diode, may be provided between the capacitive element 32 and the biasing source. In the embodiment shown in FIG. 1, the second switch 52 is further coupled between the biasing source 31 and the drift control region 21.

Figure 2:
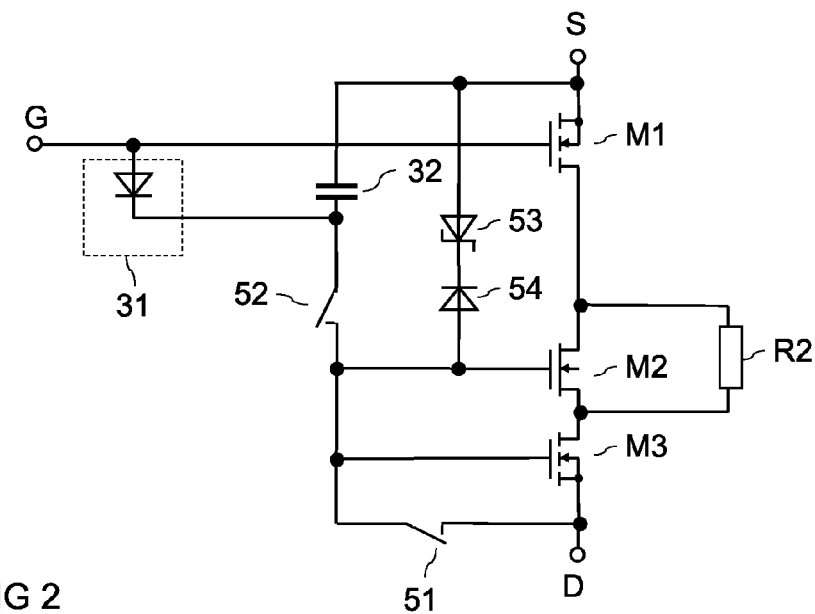
FIG. 2 shows an equivalent circuit diagram of the transistor device shown FIG. 1.

FIG. 2 shows an equivalent circuit diagram of the transistor device 1 shown in FIG. 1. Referring to FIG. 2, the equivalent circuit diagram includes three MOSFETs that have their load paths (drain-source paths) connected in series between the drain terminal D and the source terminal S. These MOSFETs are formed by the device regions shown in FIG. 1 as follows:

A first MOSFET M1 that has a source node coupled to the source terminal S is formed by the source region 12, the body region 13, a section of the drift region 14 adjoining the body region 13, the gate electrode 15 and the gate dielectric 16.

A second MOSFET M2 is formed by a section of the drift region 14 adjoining the drift control region dielectric 22, and the drift control region 21. The drift control region 21 forms a gate electrode, and the drift control region dielectric 22 forms a gate dielectric of this second MOSFET M2. A resistor R2 connected in parallel with the second MOSFET M2 represents those regions of the drift region 14 that are spaced further away from the drift control region dielectric 22 so that there is no conducting channel in this region of the drift region 14. The electrical resistance of the resistor R2 is mainly defined by a doping concentration of the drift region 14 and the specific geometry of the drift region 14.

A third MOSFET M3 is formed by a section of the drift region 14 adjoining the channel region 17, the drain region 11, the drift control region dielectric 22, and the drift control region 21. The drift control region 21 forms a gate electrode, and the drift control region dielectric 22 forms a gate dielectric of this third MOSFET M3.

Just for the purpose of explanation, it is assumed that the source region 12, the drift region 14, and the drain region 11 are n-doped, and that the channel region 17 is p-doped. In this case, the first MOSFET M1 is an n-type enhancement MOSFET, the second MOSFET M2 is an n-type depletion MOSFET, and the third MOSFET M3 is an n-type enhancement MOSFET. For the purpose of explanation, it is further assumed that the biasing source 31 includes a rectifier element, such as a diode, that couples the drift control region 21 (that forms the gate electrodes of the second and third MOSFETs M2, M3) to the gate terminal G.

One way of operation of the transistor device according to FIGS. 1 and 2 is explained in the following. For the purpose of explanation it is assumed that the source region 12, the drift region 14, and the drain region 11 are n-doped, and that the body region 13 and the channel region 17 are p-doped. It is further assumed, that the drift control region 21 has the same doping type as the drift region 14 (is n-doped).

The MOSFET is in an on-state, when a drive potential (gate potential) that generates a conducting channel in the body region 13 between the source region 12 and the drift region 14 is applied to the gate terminal G, and when a voltage is applied between the drain and the source terminals D, S. Generating a conducting channel in the body region 13 between the source region 12 and the drift region 14 is equivalent to switching on the first MOSFET M1 shown in FIG. 2. This drive potential for switching on the MOSFET can be provided by a conventional gate drive circuit (not shown in FIG. 1).

Further, in the on-state, the biasing source 31 biases the drift control region 21 to have an electrical potential that generates an accumulation channel in the drift region 14 along the drift control region dielectric 22, and an inversion channel in the channel region 17 along the drift control region dielectric 22. This is equivalent to driving the (normally-on) second MOSFET M2 in an operation state with lower conduction losses, and to switching on the third MOSFET M3. In the present embodiment, where the drift region 14 is n-doped and the channel region 17 is p-doped, the electrical potential of the drift control region 21 is a positive potential relative to an electrical potential of the drift region 14. When the drift control region 21 is coupled to gate terminal G (as shown in FIG. 2), the electrical potential of the drift control region 21 substantially corresponds to the gate potential (the electrical potential at the gate terminal G).

In the on-state of the transistor device, the first switch 51 is off (substantially non-conducting), and the second switch 52 is on (substantially conducting). This allows the drift control region 21 to be charged to an electrical potential higher than the electrical potential of the drift region 14 and the drain terminal (in the on-state the drain potential substantially corresponds to the drift region potential). Embodiments of first and second switches 51, 52 that "automatically" switch dependent on a switching state of the transistor device are explained herein below.

In the on-state, the transistor device is capable of conducting a current between the source and drain regions 12, 11 in both directions, that is when a voltage between the drain terminal D and the source terminal has a first polarity, and when the voltage between the drain terminal D and the source terminal has a second polarity opposite the first polarity.

The transistor device is in the off-state, when the channel in the body region 13 along the gate dielectric 16 is interrupted. For example, in an n-type enhancement MOSFET, this channel can be interrupted by setting the drive voltage (gate-source voltage) applied to the gate terminal G to zero. While a conventional MOSFET, in the off-state, is only capable of blocking when a voltage with a first polarity is applied between the drain and source terminals, and conducts when a voltage with an opposite second polarity is applied, the transistor device shown in FIGS. 1 and 2 is capable of blocking voltages with both polarities.

The transistor device shown in FIG. 1 includes two pn-junctions, namely a first pn-junction between the body region 13 and the drift region 14 or the section 14' of the drift region 14, respectively, and a second pn-junction between the drift region 14 and the channel region 17. In the following, an operation mode in which a voltage is applied between the drain terminal D and the source terminal S that reverse biases the first pn-junction, and forward biases the second pn-junction will be referred to as forward biased mode of the transistor device. Equivalently, an operation mode in which a voltage is applied between the drain terminal D and the source terminal S that forward biases the first pn-junction and reverse biases the second pn-junction will be referred to as reverse biased mode of the transistor device.

In the off-state, the first switch 51 is switched on in the forward biased mode and in the reverse biased mode. In this operation mode, the first switch 51 prevents the drift control region 21 from being charged through thermally generated charge carriers, and therefore prevents the drift control region 21 from generating a conducting channel in the drift region 14 and the channel region 17 or prevents an early breakdown due to the voltage applied to the load terminals.

When the transistor device switches from the on-state to the off-state in the forward biased mode, a space charge region (depletion region) expands in the drift region 14 beginning at the first pn-junction between the body region 13 and the drift region 14. This depletion region expanding in the drift region 14 causes a depletion region also to expand in the drift control region 21. Like the drift region 14, the drift control region may include a monocrystalline semiconductor material. By virtue of a depletion region expanding in the drift region 14 and a depletion region expanding in the drift control region 21, a voltage across the drift control region dielectric 22 is limited. At this time, the second switch 52 is still on, so that charge carriers that bias the drift control region 21 in the on-state, and that are removed from the drift control region 21 when the space charge region expands in the drift control region 21, can be stored in the capacitive element 32. These electrical charges stored in the capacitive element 32 can be "re-used" next time the semiconductor device switches into the on-state. This helps to keep switching losses low.

When the transistor device is in the off-state, the first switch 51 is switched on so that it couples the drift control region 21 to the drain terminal D. This allows charge carriers that are thermally generated in the drift control region 21 to flow to the drain terminal D. In this way, a charging of the drift control region 21 is prevented in the off-state. According to one embodiment, the first switch 51 is switched on after a level of the voltage between the drain terminal D and the source terminal S has reached a level of the voltage across the capacitive element. That is, the first switch 51 is not switched on before a level of the voltage between the drain terminal D and the source terminal S is equal to or above a level of the voltage across the capacitive element 32. Since during turn-off, charge is transferred from the inversion channel along the accumulation dielectric 22 into the capacitive element 32, this voltage across the capacitive element may be higher than the voltage provided by the biasing source 31 or the gate-source voltage during the on-state, respectively.

When the semiconductor device switches from the off-state in the forward biased to the on-state, the first switch 51 is switched off, while the second switch 52 is still on. Charge carriers stored in the capacitive element 32 then flow into the drift control region 21 thereby biasing the drift control region 21.

According to one embodiment, the second switch 52 is switched off after the transistor device has entered the off-state, and the charge carriers received from the drift control region 21 have been stored in the capacitive element. The second switch 52 switches on again when the transistor device switches on.

When the transistor device switches from the on-state to the off-state in the reverse biased mode, a space charge region (depletion region) expands in the drift region 14 beginning at the second pn-junction between the channel region 17 and the drift region 14. This depletion region expanding in the drift region 14 causes a depletion region also to expand in the drift control region 21. At this time, the second switch 52 is still on, so that charge carriers that bias the drift control region 21 in the on-state, and that are removed from the drift control region 21 when the space charge region expands in the drift control region 21, can be stored in the capacitive element 32. These electrical charges stored in the capacitive element 32 can be "re-used" next time the semiconductor device switches into the on-state.

By virtue of the channel region 17 that has a doping type complementary to the doping type of the source region 12, and of the drain region 14, that forms the second pn-junction with the drain region 14, and that separates the drift region 14 from the drain region 11, the transistor device is capable of blocking when a voltage is applied between the drain and source terminals D, S that forward biases the first pn junction. Thus, the transistor device, in the off-state, is capable of blocking voltages with both polarities applied to the source and drain terminals D, S.

After the transistor device has entered the off-state, the first switch 51 is switched on and the second switch 52 is switched off. According to one embodiment, there is a delay time between the time of switching off the second switch 52 and the time of switching on the first switch 51. The delay time may be between a few nanoseconds up to a few 10 microseconds or between 300 ns and 10 μs. Switching on the first switch 51 allows charge carriers that are thermally generated in the drift control region to flow to the drain terminal D. Switching off the second switch 52 prevents charge carriers stored in the capacitive element 32 from flowing back into the drift control region 21 when the first switch 51 is on.

In the MOSFET illustrated in FIG. 1, the drift control region 21 is not only dielectrically insulated from the drift region 14 by the vertical drift control region dielectric 22, but is also dielectrically insulated from the drain region 11 by a horizontal dielectric layer 26. The vertical dielectric drift control region dielectric 22 and the horizontal dielectric layer 26 form an insulating well-like structure in which the drift control region 21 is arranged. This dielectric structure will be referred to as dielectric well 20 in the following.

Optionally, the first switch 51 is not directly coupled to the drift control region 21, but is coupled to a connection region 24 adjoining the drift control region 21 on one side, and adjoining the horizontal dielectric layer 26 on a side opposite the drift control region 21. According to one embodiment, the connection region 24 has a doping type complementary to the doping type of the source region 12, and has a higher doping concentration than the drift control region 21.

Referring to FIGS. 1 and 2, an optional voltage limiting circuit is coupled between the drift control region 21 and the terminal for the reference potential (e.g., the source terminal S). This voltage limiting circuit may include a first diode 53 and a second diode 54 connected in a back-to-back configuration. According to one embodiment, the first diode 53 is a Zener diode and the second diode 54 is one of a bipolar diode (as shown) and a Zener diode (not shown). This voltage limiting circuit prevents the drift control region 21 from being charged to an electrical potential that is more than the Zener voltage of the Zener diode 53 above the electrical potential at the reference terminal. In FIGS. 1 and 2 a Zener diode is shown as one embodiment of a limiting two-terminal device. However, another type of device such as an Avalanche diode may be used as well. It is even possible to employ a Zener diode and an Avalanche diode. The voltage blocking capability of the first diode 53 and the second diode 54 is, for example, selected from a range of between 5V and 50V. The first diode 53 and the second diode 54 may have substantially the same voltage blocking capability, or different voltage blocking capabilities.

Figure 3:
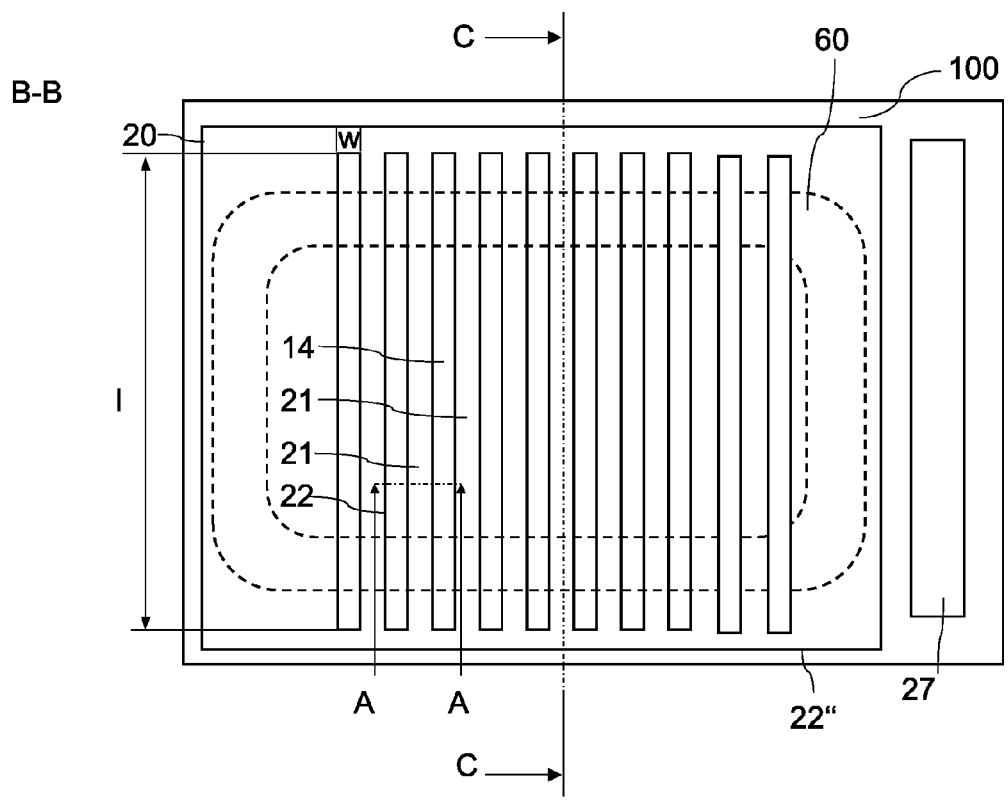
FIG. 3 shows a horizontal cross sectional view of a transistor device shown in FIG. 1 according to one embodiment.

FIG. 3 illustrates a horizontal cross sectional view of the semiconductor body 100 according to one embodiment. FIG. 3 shows a cross section in a section plane B-B that goes through the drift control region 21 and the drift region 14. Referring to FIG. 3, a plurality of dielectric wells 20 including the drift control region dielectric 22 and the horizontal dielectric layer 26 are integrated in the semiconductor body 100, with one drift control region 21 being arranged within each dielectric well 20. These dielectric wells 20 can be longitudinal structures that each have a longitudinal direction extending in a lateral direction of the semiconductor body 100 and, therefore, perpendicular to the section plane A-A illustrated in FIG. 1. The individual dielectric wells 20 are arranged distant to each other in a direction perpendicular to their longitudinal directions, wherein one drift region 14, at least one body region 13, at least one source region 12, a gate electrode 15 and a gate dielectric 16 is arranged between two dielectric wells 20. In FIG. 3, these individual device 12-16 regions are not shown. In FIG. 3, reference character 14 denotes one of the regions between two neighboring dielectric wells 20 in which these device regions are implemented.

A length I of the dielectric wells 20, which is a dimension in the longitudinal direction, is, for example, in the range of several micrometers (μm) up to several millimeters (mm). A width w of these dielectric wells 20, which is a dimension in a direction perpendicular to the longitudinal direction is, for example, in the range of between several 10 nanometers (nm) up to several 10 μm, such as, e.g., between 100 nm and 20 μm, or between 500 nm and 5 μm. Although, for the purpose of illustration, only several dielectric wells 20 are illustrated in FIG. 3, the power transistor may include up to several 10.000 ($10^5$) transistor cells, with each transistor cell including a dielectric well 20 with a drift control region 21.

In the embodiment illustrated in FIG. 3, the transistor device includes one drift control region 21 and a plurality of drift regions 14, where the individual drift regions 14 are elongated semiconductor regions that are dielectrically insulated from the neighboring drift control region 21 by vertical drift control region dielectrics 22. The individual drift regions 14 and the drift control region dielectrics 22 are embedded in one drift control region 21 in this embodiment. The drift control region 21 is dielectrically insulated from the drain region electrode 41 by a horizontal dielectric layer 26 (out of view in FIG. 3) as shown in FIG. 1. In FIG. 22, reference character 22 denotes the drift control region dielectric 22 that separates the drift control region 21 from the individual drift regions 14 inside the drift control region 21, and reference character 22" denotes a vertical dielectric layer that surrounds the drift control region 21. This vertical dielectric layer 22", the drift control region dielectrics 22, and the horizontal dielectric layer 26 (see FIG. 1) form on dielectric well 20 in this embodiment.

Figure 4:
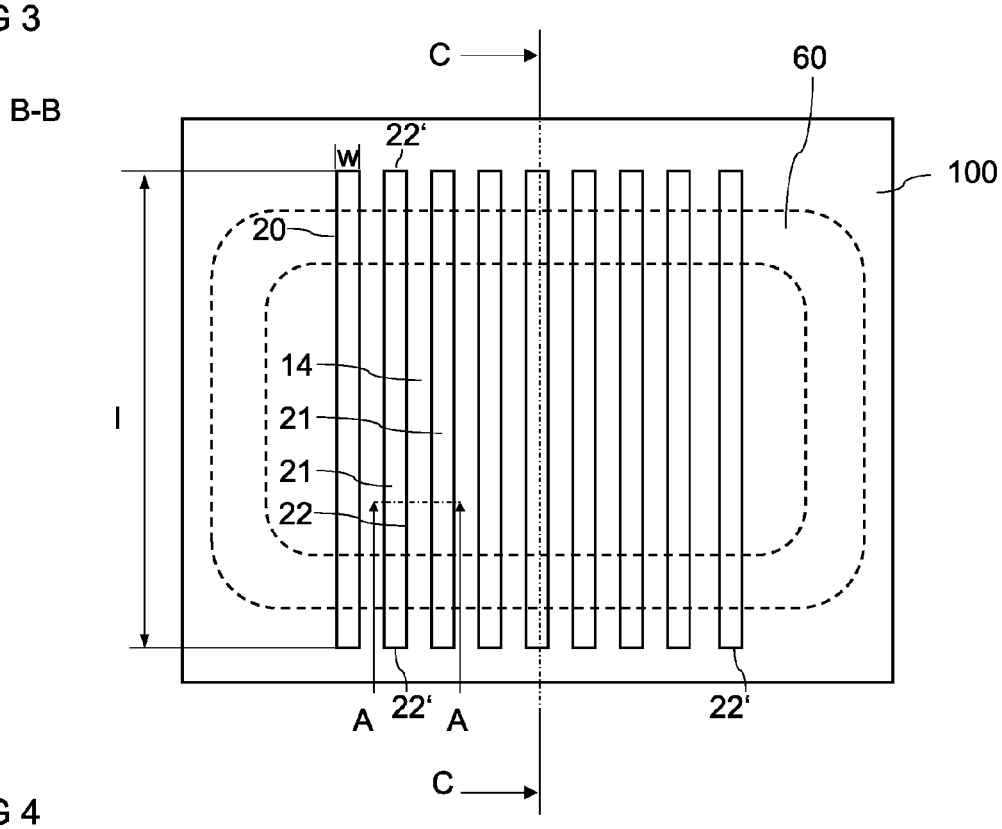
FIG. 4 shows a horizontal cross sectional view of a transistor device shown in FIG. 1 according to another embodiment.

FIG. 4 illustrates a horizontal cross sectional view of the semiconductor body 100 according to another embodiment which is a modification of the embodiment shown in FIG. 3. Like FIG. 3, FIG. 4 shows a cross section in a section plane B-B that goes through the drift control region 21 and the drift region 14.

Referring to FIG. 4, a plurality of dielectric wells 20 including the drift control region dielectric 22 and the horizontal dielectric layer 26 are integrated in the semiconductor body 100, with one drift control region 21 being arranged within each dielectric well 20. These dielectric wells 20 can be longitudinal structures that each have a longitudinal direction extending in a lateral direction of the semiconductor body 100 and, therefore, perpendicular to the section plane A-A illustrated in FIG. 1. The individual dielectric wells 20 are arranged distant to each other in a direction perpendicular to their longitudinal directions, wherein one drift region 14, at least one body region 13, at least one source region 12, a gate electrode 15 and a gate dielectric 16 is arranged between two dielectric wells 20. In FIG. 4, these individual device 12-16 regions are not shown. In FIG. 4, reference character 14 denotes one of the regions between two neighboring dielectric wells 20 in which these device regions are implemented.

A length I of the dielectric wells 20, which is a dimension in the longitudinal direction, is, for example, in the range of several micrometers (μm) up to several millimeters (mm). A width w of these dielectric wells 20, which is a dimension in a direction perpendicular to the longitudinal direction is, for example, in the range of between several 10 nanometers (nm) up to several 10 μm, such as, between 100 nm and 20 μm, or between 500 nm and 5 μm. Although, for the purpose of illustration, only several dielectric wells 20 are illustrated in FIG. 4, the power transistor may include up to several 10.000 ($10^5$) transistor cells, with each transistor cell including a dielectric well 20 with a drift control region 21.

In the embodiment illustrated in FIG. 4, the transistor device includes a plurality of drift control regions 21, where the individual drift control regions 21 are elongated semiconductor regions that are dielectrically insulated from the neighboring drift regions 14 and the drain region 11. In the horizontal (lateral) direction the individual drift control regions 21 are surrounded by one drift region 14. In other words, the individual drift control regions 21 and the drift control region dielectric 22 are embedded in one drift region 14 in this embodiment. In this embodiment, there are a plurality of dielectric wells 20 each including side-walls formed by the drift control regions dielectrics 22 and a bottom formed by a horizontal dielectric layer 26, with each of these dielectric wells 20 including one drift control region 21. In FIG. 4, reference character 22' denotes vertical dielectric layers at the horizontal ends of the individual dielectric wells.

Figure 5:
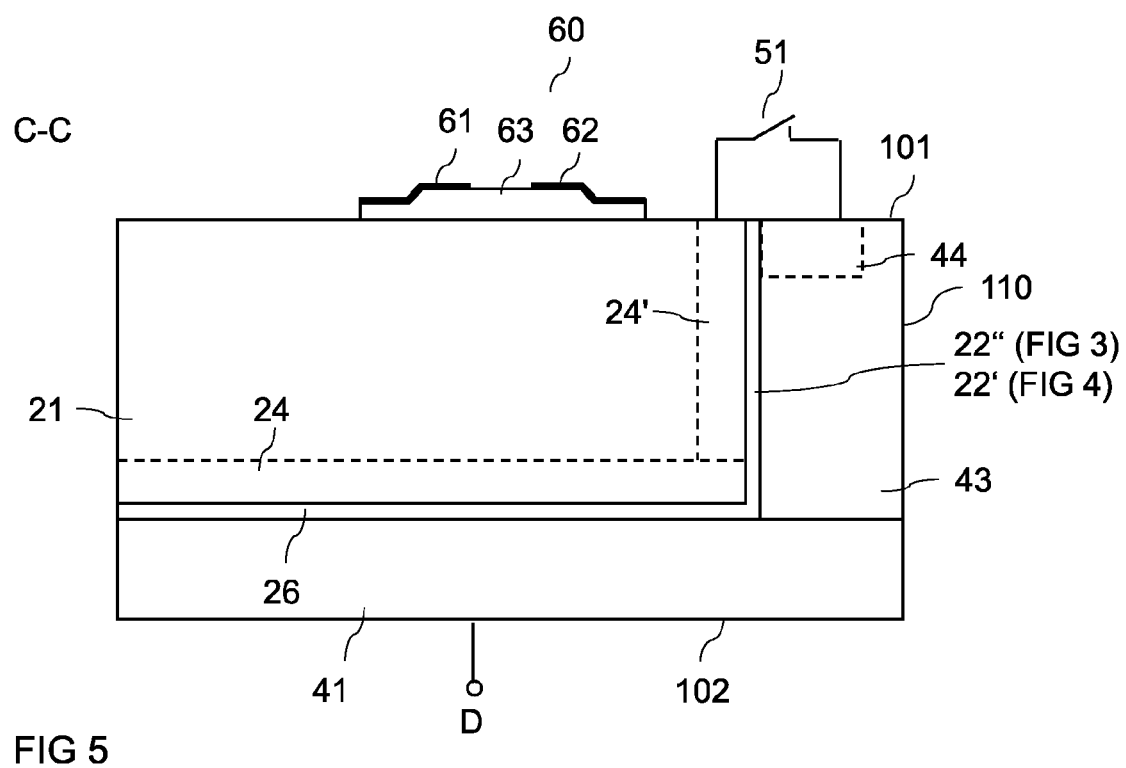
FIG. 5 shows another vertical cross sectional view of the transistor device shown in FIG. 1.

FIG. 5 shows an embodiment of how the first switch 51 can be connected to the drift control region 21, and the connection region 24, respectively. FIG. 5 illustrates a vertical cross sectional view of the at least one dielectric well 20 in a vertical section plane C-C shown in FIGS. 3 and 4. In this embodiment, the first switch 51 is connected between the drift control region 21 and a connection region 43 connected to the drain electrode 41 in the region of a first surface 101 of the semiconductor body 100. In this embodiment, the connection region 43 adjoins an edge surface 110 of the semiconductor body 100 so that an electrical potential of this connection region 43 in an off-state of the transistor device corresponds to the electrical potential of the drain electrode 41, and the drain terminal D, respectively. Optionally, the first switch 51 is connected to a contact region 44 that is arranged in the connection region 43 and is more highly doped than the connection region 43. A doping type and a doping concentration of the connection region may correspond to a doping type and a doping concentration of the drift region 14.

In the drift control region 21 there may be a further connection region 24' of the same doping type as the connection region 24 at the bottom of the dielectric well 20. This further connection region extends at an outer end of the dielectric well 20 along the vertical dielectric layer 22" (see FIG. 3) or at a horizontal end of the dielectric well 20 along the vertical dielectric layer 22' (see FIG. 4) from the first surface 101 to the connection region 24 at the bottom of the dielectric well 20. The first switch 51 is connected to this further connection region 24 at the first surface 101.

Referring to FIGS. 3 and 4, the transistor device optionally includes a ring-shaped edge termination structure that is spaced apart from longitudinal ends of the dielectric wells 20 and is in the region of the first surface 101 of the semiconductor body 100. Referring to FIG. 5, the edge termination structure 60 may include one or more field plates 61 and/or 62 that are arranged above the first surface 101 of the semiconductor body 100 on a dielectric layer 63. According to one embodiment, a first field plate 61, which is a field plate arranged more distant to the edge surface 110 may be electrically connected to one of the gate electrode 15, the source region 12, and the body region 13 of the transistor device. A second field electrode 62, which is arranged closer to edge surface 110, may, for example, be electrically connected to one of the drain region 11, and the connection region 43 of the semiconductor body 100. Implementing the edge termination structure 60 with field electrodes, such as field electrodes 61, 62 illustrated in FIG. 5, is only one of a plurality of different possibilities to implement the edge termination structure 60. According to further embodiments (not illustrated), the edge terminations structure additionally or alternatively to the field electrodes 61, 62 includes doped field rings which optionally are connected to field plates, JTE-(junction termination extension) doping, electroactive coatings like e.g. diamond-like carbon, semiisolating coatings or VLD-(variation of Lateral Doping)-regions to name a few of the possible edge terminations. According to further embodiments (not shown) a combination of one or more of these edge termination means may be used. These types of edge termination structures are commonly known, so that no further explanations are required in this regard.

The first switch 51 can be integrated in the same semiconductor body 100 in which the active device regions of the semiconductor device are integrated. However, it is also possible to implement the first switch 51 in a further semiconductor body that is mounted to the semiconductor body 100 in a chip-on-chip technology, or that is located next to the semiconductor body 100 in a chip-by-chip technology.

According to one embodiment, the first switch 51 is implemented as a lateral transistor in a dielectric well 27 of the semiconductor body 100. This dielectric well 27 is shown in FIGS. 3 and 4. Referring to FIG. 3, this dielectric well 27 is arranged outside the edge termination structure 60, that is between the edge termination structure 60 and the edge of the semiconductor body 100. The dielectric well 27 includes vertical dielectric layers and a horizontal dielectric layer above the drain electrode 41. A semiconductor region within the dielectric well 27 is dielectrically insulated from surrounding semiconductor regions. The first switch 51 can be implemented to include one or more transistor devices within the dielectric well 27.

Figure 6:
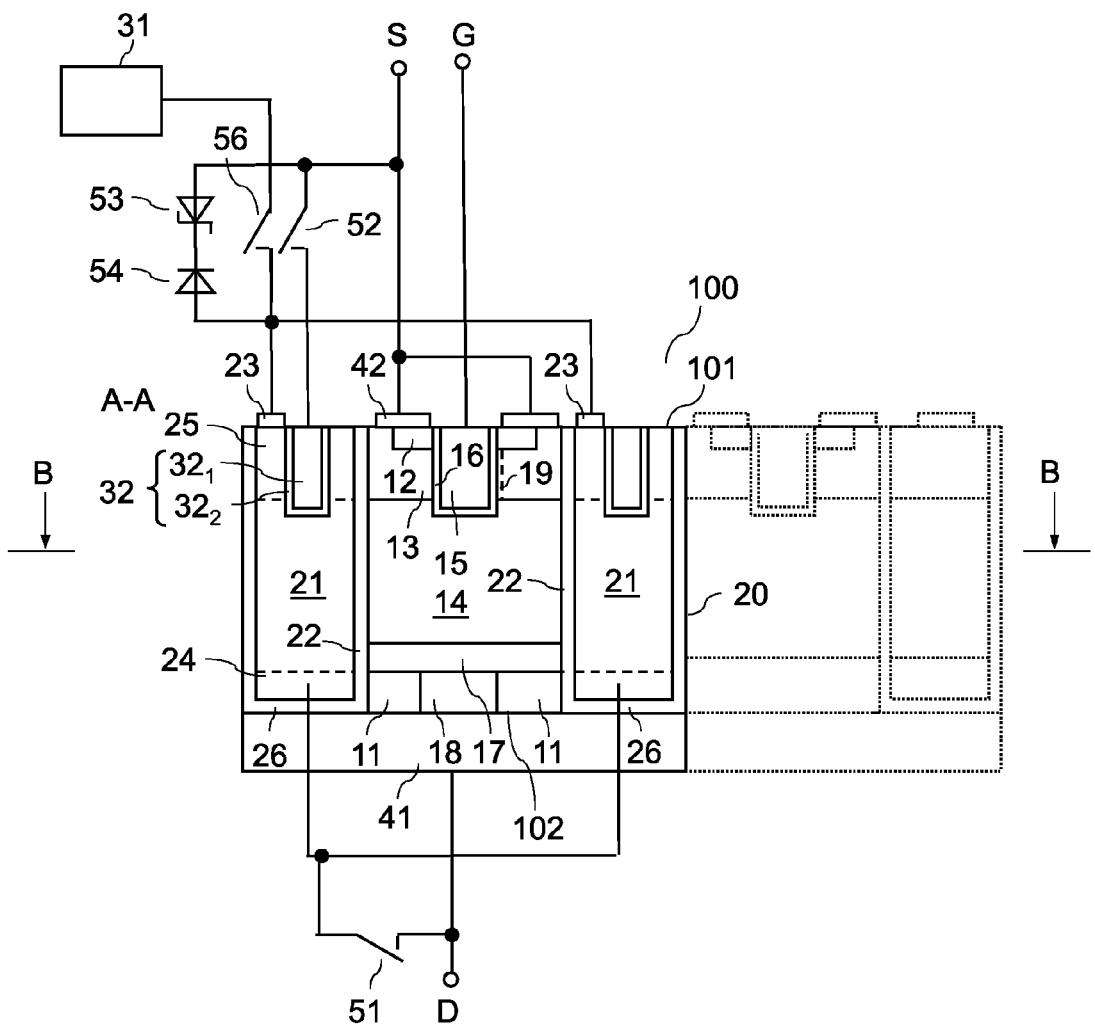
FIG. 6 shows a vertical cross sectional view of a reverse blocking transistor device according to another embodiment.

FIG. 6 illustrates a vertical cross-sectional view of a transistor device according to a further embodiment. In this embodiment, the capacitive element 32 is integrated in the semiconductor body 100. According to one embodiment, the capacitive element 32 includes a plurality of capacitor cells that are connected in parallel, wherein at least one capacitor cell is integrated in one drift control region 21. In the embodiment shown in FIG. 6, one capacitor cell is integrated in each drift control region 21. However, it is also possible to implement several capacitor cells in one drift control region 21. Further, it is possible to integrate capacitor cells only in some of the plurality drift control regions 21.

Referring to FIG. 6, each capacitor cell includes a capacitor electrode $32_1$ and a capacitor dielectric $32_2$ that dielectrically insulates the capacitor electrode $32_1$ from the drift control region 21 and the connection region 25, respectively. The drift control region 21 and the connection region 25, respectively, form a second capacitor electrode of the capacitor cell. In this embodiment, the second switch 52 is connected between the capacitor electrode $32_1$ and the terminal for the reference potential (source terminal S). In order to prevent the biasing source 31 from charging the drift control region 21 when the transistor device is in the reverse biased mode, a further switch 56 is coupled between the biasing source 31 and the drift control region 21. This further switch 56 is switched on and off synchronously with the second switch 52. Like the first switch 51 and the second switch 52 the further switch 56 may be integrated in a dielectric well in the semiconductor body 100, or may be integrated in a further semiconductor body (not shown) separate from the first semiconductor body.

Figure 7:
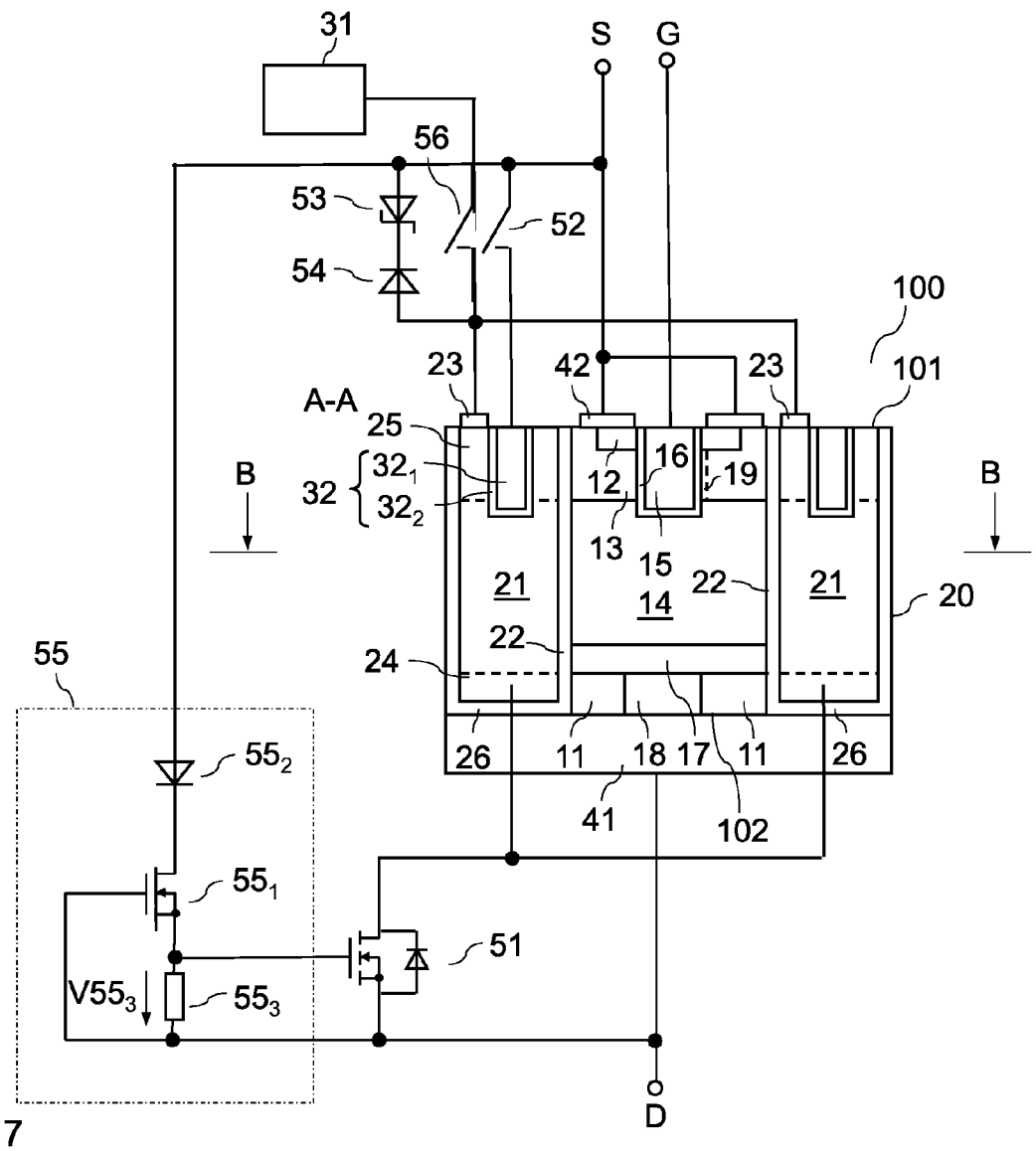
FIG. 7 shows a vertical cross sectional view of a reverse blocking transistor device according to yet another embodiment.

FIG. 7 shows one embodiment of the first switch 51, and one embodiment of a drive circuit 55 that "automatically" switches the first switch 51 dependent on a voltage between the drain and source terminals D, S. In this embodiment, the first switch 51 is implemented as a MOSFET, specifically as an n-type enhancement MOSFET. The drive circuit 55 is connected between the drain and source terminals D, S. The drive circuit includes: a further MOSFET $55_1$, which is also implemented as an n-type enhancement MOSFET in this embodiment; a rectifier element $55_2$, such as a diode; and a resistor $55_3$. In the drive circuit 55, a load path (drain-source path) of the MOSFET $55_1$, the rectifier element $55_2$, and the resistor $55_3$ are connected in series between the drain and the source terminals D, S. The first switch 51 and the MOSFET $55_1$ of the drive circuit 55 are both driven by a voltage $V55_3$ across the resistor $55_3$, wherein a drive voltage (gate-source voltage) of the switch 51 corresponds to the voltage $V55_3$, and wherein a drive voltage (gate-source voltage) of the depletion MOSFET $55_1$ corresponds to $-V55_3$. In the present embodiment, the resistor $55_3$ is connected between the drain terminal D of the transistor device and a source node of the depletion MOSFET $55_1$. A gate node of this depletion MOSFET $55_1$ is coupled to the drain terminal D. Further, a gate node of the switch 51 is coupled to a circuit node common to depletion MOSFET $55_1$ and the resistor $55_3$.

One way of operation of the drive circuit 55 in the forward biased mode of the transistor device, and in the reverse biased mode of the transistor device is explained in the following. For the purpose of explanation it is again assumed that the transistor device is an n-type transistor device. In this case, a positive voltage between the drain and source terminals D, S forward biases the transistor device, and a negative voltage between the drain and source terminals D, S reverse biases the transistor device.

In the reverse biased mode, the rectifier element $55_2$ of the drive circuit 55 is reverse biased so that there is no current through the depletion MOSFET $55_1$ and the resistor $55_3$. The gate-source voltage of the switch 51 is substantially zero, so that the switch 51 is off. However, in this operation mode, a body diode of the switch 51 (this body diode is also illustrated in FIG. 7) provides a conducting channel between the drain terminal D and the drift control region 21 and allows thermally generated charge carriers to flow to the drain terminal D.

In the forward biased mode, the diode $55_2$ is conducting, and a current flows through the depletion MOSFET $55_1$ and the resistor $55_3$. A magnitude of the voltage $V55_3$ across the resistor $55_3$ substantially corresponds to a magnitude of the pinch-off voltage of the depletion MOSFET $55_1$. The voltage $V55_3$ across the resistor $55_3$ switches on the switch 51 in a forward biased mode.

According to a further embodiment (not shown), the drive circuit 55 includes a further switch instead of the diode $55_2$. This switch is driven dependent on a polarity of the voltage between the drain and source terminals D, S such that it switches off when the transistor device is forward biased, and switches on when the transistor device is reverse biased.

In the on-state of the transistor device, a voltage between the drain and source terminals D, S is too low for the drive circuit 55 to switch on the switch 51. In this operation state, the body diode of the switch 51 allows the electrical potential of the drift control region 51 to increase above the drain potential so that a conducting channel can be generated in the drift region 14 and in the channel region 17 along the drift control region dielectric 22.

Figure 8:
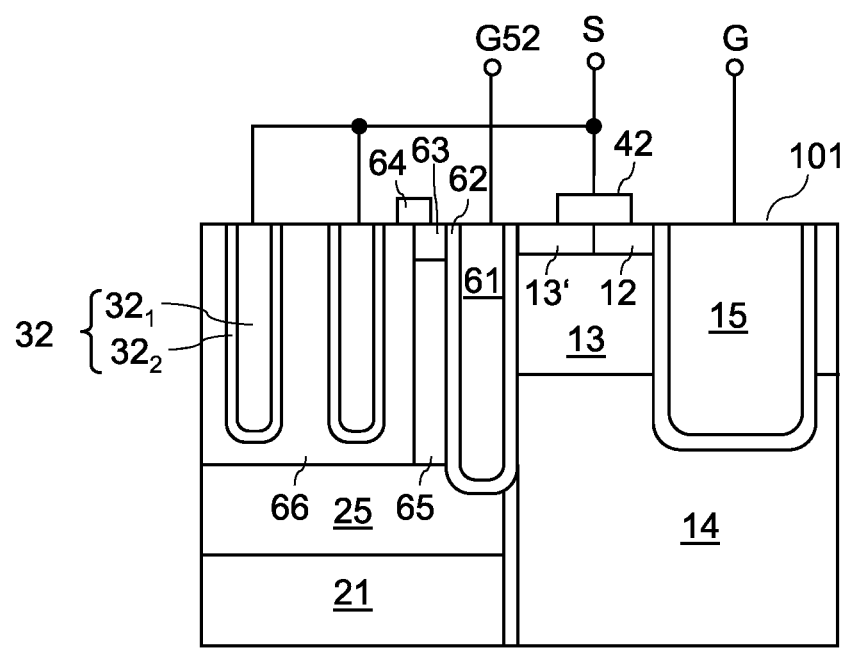
FIG. 8 shows one embodiment of a switching element implemented in the reverse blocking transistor device in detail.

FIG. 8 schematically illustrates one embodiment for implementing the second switch 52 that, referring to FIGS. 1, 2, and 5, is connected in series with the capacitive element 32 between the source terminal S and the drift control region 21. FIG. 8 only shows a section of the semiconductor body 100 close to the surface 101 where the second switch 52 is integrated.

In the present embodiment, the second switch 52 is implemented as a MOSFET that includes: a gate electrode 61 that is dielectrically insulated from a body region 65 by a gate dielectric 62; and a body region 65 arranged between a source region 63 and the connection region 25. In this embodiment, the at least one capacitor cell of the capacitive element 32 is integrated above the connection region 25. Each of these capacitor cells includes a first capacitor electrode 32$_1$ electrically connected to the reference terminal (which is the source terminal S in this embodiment), and a capacitor dielectric 32$_2$ that dielectrically insulates the first capacitor electrode 32$_1$ from a second capacitor electrode 66. The second capacitor electrode 66 is a doped semiconductor region 66 of the same doping type as the body region 65 of the MOSFET and complementary to the connection region 25. This second capacitor electrode 66 can be common to several capacitor cells and is connected to the source region 63 of the MOSFET through an electrode 64. This electrode can be arranged above the first surface 101 (as illustrated), but could also be arranged below the first surface 101. The source region 63 of the MOSFET is doped complementary to the body region 65 and has the same doping type as the connection region 25, wherein the connection region 25 acts as a drain region of the MOSFET.

In the on-state of the MOSFET, the MOSFET provides a conducting channel between the capacitor cells, in particular between the second capacitor electrode 66, and the connection region 25. In this way, charge carriers can be provided from the capacitor cells to the drift control region 21 when the transistor device switches on, and charge carriers provided by the drift control region and the connection region 25, respectively, can be stored in the capacitor cells when the transistor device switches off.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device comprising at least one transistor cell, the at least one transistor cell comprising:
    a drift region, a source region, a body region arranged between the source region and the drift region, and a drain region, wherein the drift region is arranged between the body region and the drain region;
    a gate electrode adjacent the body region and dielectrically insulated from the body region by a gate dielectric;
    a channel region of a doping type complementary to a doping type of the drain region that is arranged between the drift region and the drain region;
    a drift control region adjacent the drift region and dielectrically insulated from the drift region and the channel region by a drift control region dielectric; and
    a first switch coupled between the drift control region and the drain region.

2. The transistor device of claim 1, further comprising:
    a capacitive element coupled between the drift control region and a node for a reference potential; and
    a second switching element coupled in series with the capacitive element.

3. The transistor device of claim 2, wherein the node for the reference potential is coupled to the source region.

4. The transistor device of claim 1, wherein the drain region and the channel region are electrically coupled to a drain electrode.

5. The transistor device of claim 1, wherein the channel region separates the drift region from the drain region.

6. The transistor device of claim 1, further comprising:
    a voltage limiting circuit coupled between the drift control region and a node for a reference potential.

7. The transistor device of claim 1, further comprising:
    a drive circuit configured to drive the first switch dependent on a voltage between the source region and the drain region.

8. The transistor device of claim 7, wherein the first switch comprises a MOSFET.

9. The transistor device of claim 1, wherein the first switch is integrated in a dielectric well in the semiconductor body.

10. The transistor device of claim 2, wherein the capacitive element is integrated in the semiconductor body.

11. The transistor device of claim 2, wherein the capacitive element comprises at least one capacitor cell, the capacitor cell comprising:
- a first capacitor electrode coupled to the node for the reference potential;
- a second capacitor electrode; and
- a capacitor dielectric between the first capacitor electrode and the second capacitor electrode.

12. The transistor device of claim 11, further comprising:
a connection region adjoining the drift control region,
wherein at least one of the connection region, and the drift control region forms the second capacitor electrode.

13. The transistor device of claim 11, further comprising:
a connection region adjoining the drift control region,
wherein the second capacitor electrode is a doped semiconductor region of a doping type complementary to a doping type of the connection region, and adjoining the connection region.

14. The transistor device of claim 13,
wherein the second switch is integrated in the semiconductor body, and
wherein the second switch is connected between the second capacitor electrode and the connection region.

15. The transistor device of claim 14, wherein the second switch comprises a MOSFET.

16. The transistor device of claim 15, wherein the MOSFET comprises:
- a source region electrically connected to the second capacitor electrode;
- a body region adjoining the source region; and
- a gate electrode adjacent the body region and dielectrically insulated from the body region by a gate dielectric.

17. The transistor device of claim 16,
wherein the second capacitor electrode and the source region have complementary doping types,
wherein the second capacitor electrode and the body region have the same doping type, and
wherein the source region and the connection region have the same doping type.

18. The transistor device of claim 17, wherein the second capacitor electrode adjoins the body region.

19. The transistor device of claim 16, wherein the connection region adjoins the body region.

20. A method for operating a transistor device, the transistor device comprising a drift region, a source region, a body region arranged between the source region and the drift region, and a drain region, wherein the drift region is arranged between the body region and the drain region; a gate electrode adjacent the body region and dielectrically insulated from the body region by a gate dielectric; a channel region of a doping type complementary to a doping type of the drain region that is arranged between the drift region and the drain region; a drift control region adjacent the drift region and dielectrically insulated from the drift region, and the channel region by a drift control region dielectric; and
- a first switch coupled between the drift control region and the drain region; the method comprising:
- switching on the first switch when the transistor device is in an on-state; and
- switching off the first switch when the transistor device is in an off-state.

21. The method of claim 20, wherein the transistor device further comprises:
- a capacitive element coupled between the drift control region and a node for a reference potential; and
- a second switching element coupled in series with the capacitive element.

22. The method of claim 21, wherein the node for the reference potential is coupled to the source region.

23. The method of claim 20, wherein operating the transistor device in the on-state comprises applying an electrical potential to the gate electrode that causes the gate electrode to generate a conducting channel in the body region.

24. The method of claim 21, further comprising:
switching on the second switch when the transistor device is in the on-state.

25. The method of claim 24, further comprising:
switching off the second switch after the transistor device has switched from the on-state to an off-state.

* * * * *